US 6,692,795 B2

(12) United States Patent
Won et al.

(10) Patent No.: US 6,692,795 B2
(45) Date of Patent: Feb. 17, 2004

(54) METHOD FOR FABRICATING SEMICONDUCTOR DEVICE HAVING RUTHENIUM LAYER AND EQUIPMENT FOR FABRICATING THE SAME

(75) Inventors: Seok-jun Won, Seoul (KR); Soon-yeon Park, Daegu (KR); Cha-young Yoo, Suwon (KR)

(73) Assignee: Samsung Electronics, Co., Ltd., Kyungki-Do (KR)

( * ) Notice: Subject to any disclaimer, the term of this patent is extended or adjusted under 35 U.S.C. 154(b) by 10 days.

(21) Appl. No.: 10/026,205

(22) Filed: Dec. 21, 2001

(65) Prior Publication Data

US 2003/0022521 A1 Jan. 30, 2003

(51) Int. Cl.[7] .............................. C23C 8/00; C23C 14/34; B05D 1/36; H01L 21/31
(52) U.S. Cl. .................. 427/585; 204/192.15; 427/250; 427/404; 438/758; 438/761; 438/763
(58) Field of Search ................ 204/192.15, 298.25, 204/298.26; 427/585, 250, 404; 118/719, 715; 438/761, 763, 758

(56) References Cited

U.S. PATENT DOCUMENTS 5,186,718 A * 2/1993 Tepman et al. ............ 29/25.01

5,292,393 A * 3/1994 Maydan et al. ......... 156/345.32
6,423,593 B1 * 7/2002 Yamamoto et al. ......... 438/240
2002/0030210 A1 * 3/2002 Matsui et al. ............... 257/296
2002/0047201 A1 * 4/2002 Suzuki ....................... 257/751

FOREIGN PATENT DOCUMENTS

KR          0066676         8/1999

* cited by examiner

Primary Examiner—Steven H. VerSteeg
(74) Attorney, Agent, or Firm—F. Chau & Associates, LLP

(57) ABSTRACT

A method for fabricating a semiconductor device is provided. The method includes the steps of: forming an insulating layer having an opening region on a semiconductor substrate; forming a first ruthenium layer on the insulating layer and the opening region by sputtering at a first pressure; forming a second ruthenium layer on the first ruthenium layer by first chemical vapor deposition (CVD) at a first flow rate of oxygen gas and at a second pressure, wherein the second pressure is greater than the first pressure; and forming a third ruthenium layer on the second ruthenium layer by second CVD at a second flow rate of oxygen gas and at a third pressure, wherein the third pressure is greater than the first pressure.

19 Claims, 6 Drawing Sheets

METHOD FOR FABRICATING SEMICONDUCTOR DEVICE HAVING RUTHENIUM LAYER AND EQUIPMENT FOR FABRICATING THE SAME

BACKGROUND OF THE INVENTION

1. Field of the Invention

The present invention relates to a method and a device for fabricating a semiconductor device, and more particularly, to a method and a device for fabricating a semiconductor device having a ruthenium layer.

2. Description of the Related Art

Recently, efforts have been made to obtain larger capacitance values in capacitors of semiconductor device using noble metals such as ruthenium (Ru), platinum (Pt), iridium (Ir), and osmium (Os) as a lower electrode or an upper electrode of a capacitor. Among the noble metals, ruthenium has excellent leakage current characteristics and easier processing characteristics.

A conventional method for forming a ruthenium layer is by sputtering. The ruthenium layer formed by sputtering has a dense structure and good surface morphology, thereby generating excellent leakage current characteristics and sheet resistance. But the ruthenium layer formed by sputtering has poor step coverage characteristics. It is therefore difficult or not suitable to form three-dimensional structures such as cylindrical or fin shaped electrodes.

Another method for forming a ruthenium layer is chemical vapor deposition (CVD). The ruthenium layer formed by the CVD has good step coverage, but poor surface morphology; therefore, such layer does not have good leakage current and sheet resistance characteristics.

Accordingly, a need exists for a method of fabricating a ruthenium layer having excellent leakage, surface morphology and step-coverage characteristics.

Japan patent application publication No. 11-340435 proposes a method to improve surface morphology and step coverage characteristics, and to reduce deposition time. The method includes the steps of forming a ruthenium seed layer by sputtering, and a ruthenium main layer by CVD. But the layer doesn't have good lateral surface morphology as shown in FIG. 1.

A conventional method of forming a ruthenium layer is illustrated by FIGS. 2A, 2B, and 3.

Referring to FIG. 2A, a silicon oxide layer 22 having an opening region is formed on a semiconductor substrate 20. A ruthenium layer 24 having a ruthenium seeding layer by sputtering and a ruthenium main layer by CVD is formed on the silicon oxide 15 layer 22 and inside of the opening region. The inside of the opening region is filled with an Insulating material 26 such as a silicon oxide to completely cover the ruthenium layer 24. The top surface of the insulating material 26 and the top surface of the ruthenium layer 24 are removed by process such as etch back or chemical mechanical polishing (CMP) until the surface of the silicon oxide layer 22 is exposed, thereby forming a 20 recessed ruthenium layer 24a and a recessed insulating material 26a as shown in FIG. 2B. To make a cylindrical ruthenium layer, the silicon oxide layer 22 and the recessed insulating material 26a are removed by an etchant such as a buffered oxide etchant (BOE). But the morphology of the recessed ruthenium layer 24a is not good. The etchant may permeate under the semiconductor substrate 20, thereby deteriorating the interface between the recessed ruthenium layer 24a and the semiconductor substrate 20 and lowering the reliability of the semiconductor device.

Another problem of using a ruthenium layer is that a ruthenium for forming of the ruthenium layer is aggregated during heat treatment after forming a capacitor, thereby exposing under the ruthenium layer and again lowering the reliability of a semiconductor device.

Thus, notwithstanding these above-described methods of forming semiconductor capacitors, there still continues to be a need for improved method for semiconductor capacitors having a ruthenium layer and device for manufacturing the same.

SUMMARY OF THE INVENTION

A method for fabricating a semiconductor device is provided, which includes the steps of: forming an insulating layer having an opening region on a semiconductor substrate; forming a first ruthenium layer on the insulating layer and the opening region by sputtering at a first pressure; forming a second ruthenium layer on the first ruthenium layer by first chemical vapor deposition (CVD) at a first flow rate of oxygen gas and at a second pressure, wherein the second pressure is greater than the first pressure; and forming a third ruthenium layer on the second ruthenium layer by second CVD at a second flow rate of oxygen gas and at a third pressure, wherein the third pressure is greater than the first pressure.

According to a preferred embodiment of the present invention, the first flow rate of oxygen gas is higher than the second flow rate of oxygen gas. The second pressure is greater than the third pressure, the first pressure is in the range from about 0.5 mTorr to about 5 mTorr, the second pressure is in the range from about 10 Torr to about 40 Torr, and the third pressure is in the range from about 0.1 Torr to about 10 Torr. The first flow rate of oxygen gas is in the range from about 10 sccm to about 3,000 sccm.

According to a preferred embodiment of the present invention, an inert gas is further included flowing with the oxygen gas. The flow rate of the inert gas is in the range from about 10 sccm to 2,000 sccm, and the second flow rate of oxygen gas is in the range from about 10 sccm to about 300 sccm.

According to a preferred embodiment of the present invention, the step of forming the first ruthenium layer is performed at a semiconductor substrate temperature of about 100° C. to about 500° C. The step of forming the second ruthenium layer and the step of forming the third ruthenium layer are performed at a semiconductor substrate temperature of about 250° C. to about 450° C. The step of forming the second ruthenium layer is performed at a semiconductor substrate temperature lowered by about 10° C. to about 30° C. than the step of forming the third ruthenium layer. The step of forming the first ruthenium layer, the step of forming the second ruthenium layer, and the step of forming the third ruthenium layer are performed in-situ. The step of forming the second ruthenium layer and the step of forming the third ruthenium layer are performed in a same chamber.

According to a preferred embodiment of the present invention, the step of forming the second ruthenium layer and the step of the forming the third ruthenium layer use a ruthenium containing organometallic compound. The ruthenium containing organometallic compound includes $Ru(EtCp)_2$, wherein EtCp denotes ethyl cyclopentadienyl ligand.

An apparatus for manufacturing a semiconductor device is also provided, which includes: a transfer chamber transferring a wafer; a plurality of process chambers connected to the transfer chamber; and a pressure control unit connected to the transfer chamber for controlling pressure therethrough, wherein the plurality of process chambers has at least one chemical vapor deposition (CVD) chamber for CVD and at least one sputtering chamber for sputtering, and the pressure control unit maintains close to a target pressure of the CVD chamber and the sputtering chamber.

An apparatus for manufacturing a semiconductor device is also provided, which includes: a first transfer chamber having a first robot to transfer a wafer; a second transfer chamber having a second robot to transfer the wafer, wherein the second transfer chamber is connected to the first transfer chamber; a sputtering chamber connected to the first transfer chamber; at least one CVD chamber connected to the second transfer chamber; and a pressure control unit connected to the second transfer chamber, wherein the pressure control unit maintains close to a target pressure of the CVD chamber.

BRIEF DESCRIPTION OF THE DRAWINGS

The above and other objects and advantages of the present invention will become more apparent by describing in detail preferred embodiments thereof with reference to the accompanying drawings in which.

DETAILED DESCRIPTION OF PREFERRED EMBODIMENTS

Hereinafter, embodiments of the present invention will be described in detail with reference to the attached drawings. However, the embodiments of the present invention may be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity. Like numbers refer to like elements throughout. Also, when it is written that a layer is formed "on" another layer or a substrate, the layer may be formed directly on the other layer or the substrate, or other layers may intervene therebetween.

Figure 4:
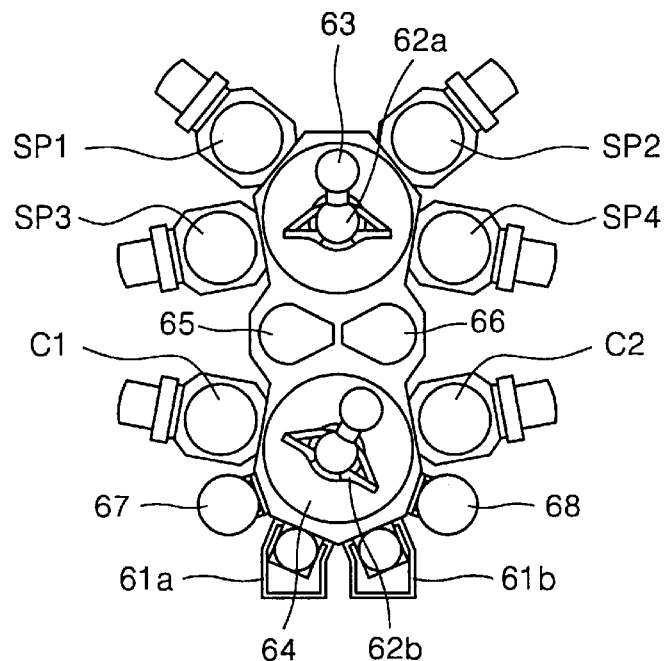
FIG. 4 shows an apparatus for fabricating a semiconductor device having a ruthenium layer according to a preferred embodiment of the present invention.
Figure 5:
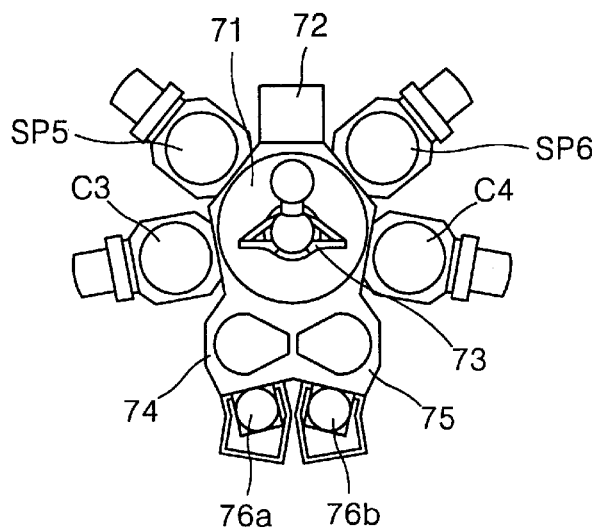
FIG. 5 shows an apparatus for fabricating a semiconductor device having a ruthenium layer according to another preferred embodiment of the present invention.

FIGS. 4 and 5 are schematic diagram of apparatuses for fabricating a semiconductor device having a ruthenium layer according to the present invention.

Referring to FIG. 4, an apparatus for fabricating a semiconductor device includes: two transfer chambers 63 and 64, wherein the numerals 63 and 64 denote a first transfer chamber and a second transfer chamber, respectively; a plurality of process chambers SP1, SP2, SP3, SP4, C1, and C2, wherein the process chambers SP1, SP2, SP3, and SP4 are connected to the first transfer chamber 63, and the process chambers C1 and C2 are connected to the second transfer chamber 64; load-lock chambers 61a and 61b having cassettes (not shown) to position the wafers; and a preliminary cleaning chamber 65 and a second cooling chamber 66 positioned between the first transfer chamber 63 and the second transfer chamber 64.

The load-lock chambers 61a and 61b allow wafers to be placed into the apparatus. The process chambers SP1, SP2, SP3, SP4, C1, and C2 are connected to a source gas line (not shown) or a reaction gas line (not shown) which are needed for forming layers.

The inside of the first transfer chamber 63 is maintained at a suitable pressure for processing the wafer by sputtering, and the inside of the second transfer chamber 64 is maintained at a suitable pressure for processing by CVD. One of the process chambers SP1, SP2, SP3, and SP4 can perform sputtering to form a ruthenium seeding layer, and the other process chambers except one process chamber for forming the ruthenium seeding layer can perform sputtering for forming an aluminum layer or a titanium layer which can be used as an electric wire or a diffusion barrier layer. The process chambers C1 and C2 process the wafer by CVD to form a ruthenium seeding buffer layer and a ruthenium main layer. For example, if the process chamber C1 is used for forming a ruthenium seeding buffer layer, the process chamber C2 is used for forming a ruthenium main layer. Likewise, if the process chamber C2 is used for forming a ruthenium seeding buffer layer, the process chamber C1 is used for forming a ruthenium main layer.

Each of the first transfer chamber 63 and the second transfer chamber 64 has robots 62a and 62b, respectively. The robots 62a and 62b transfer the wafers to a corresponding process chamber. The second transfer chamber 64 connected to the process chamber C1 and C2 has a pressure control unit 67 and a first cooling chamber 68. The pressure control unit 67 regulates the pressure of each of the processing chambers C1 and C2 during forming the ruthenium seeding buffer layer and the ruthenium main layer. The change of the pressure can be performed by a vacuum pump (not shown) connected to the process chambers C1 and C2.

After forming the ruthenium seeding buffer layer and the ruthenium main layer in the processing chambers C1 and C2, the wafers are transferred to the first cooling chamber 68 to cool the wafers.

The preliminary cleaning chamber 65 and the second cooling chamber 66 clean and cool the wafers, respectively, before sputtering or CVD.

FIG. 5 is a schematic diagram of an apparatus for fabricating a semiconductor device having a ruthenium layer according to another embodiment of the present invention.

Referring to FIG. 5, the apparatus includes: a transfer chamber 71 having a robot 73 for transferring a wafer; a plurality of process chambers SP5, SP6, C3, and C4; a pressure control unit 72; a preliminary cleaning chamber 74 and a cooling chamber 75 connected to the transfer chamber 71; and load-lock chambers 76a and 76b connected to the transfer chamber 71. The process chambers SP5 and SP6 are connected to the transfer chamber 71 for sputtering, the process chamber C3 and C4 are connected to the transfer chamber 71 for CVD. The pressure control unit 72 is also connected to the transfer chamber 71 for regulating inside pressure of the plurality of process chambers SP5, SP6, C3, and C4. The preliminary cleaning chamber 74 and the cooling chamber 75 clean and cool before sputtering and CVD of the wafer, respectively.

Note that functions of the transfer chamber 71, the pressure control unit 72, the process chambers SP5, SP6, C3, and C4, the preliminary cleaning chamber 74, the cooling chamber 75, the load-lock chambers 76a and 76b are nearly the same as described in FIG. 4. A significant characteristic of the two apparatuses is that the apparatus of FIG. 5 does not include the second transfer chamber 64 and two of the process chambers such as SP3 and SP4 that are present in FIG. 4.

Figure 6A:
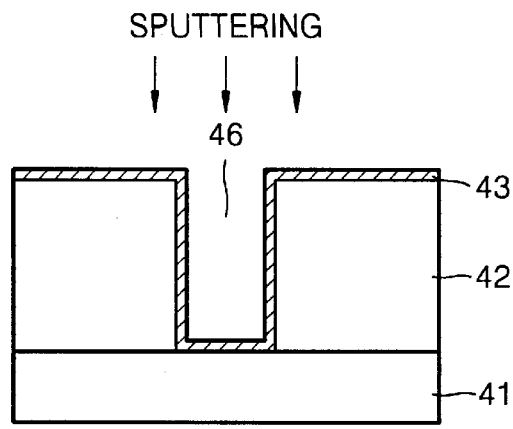
FIGS. 6A through 6C are cross-sectional views of structures illustrating a method of fabricating a semiconductor device having a ruthenium layer according to the present invention.
Figure 6B:
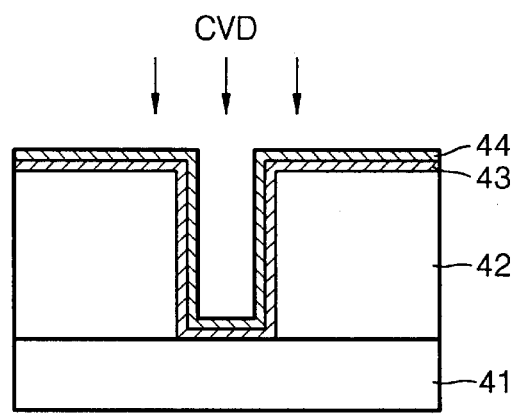
Figure 6C:
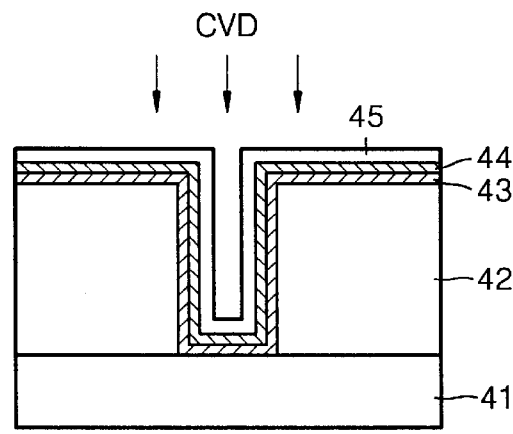

Referring to FIGS. 6A through 6C, a method of forming a ruthenium layer will be described according to an embodiment of the present invention. Note that steps of forming the ruthenium layer can be performed using one of the two apparatuses as described in FIG. 4 and FIG. 5, however, steps of forming the ruthenium layer are described using the apparatus of FIG. 4 for convenience.

Referring to FIG. 6A, a wafer has an insulating layer 42 such as a silicon oxide layer on a semiconductor substrate 41. The insulating layer 42 has an opening region 46 on the semiconductor substrate 41.

The wafer having the insulating layer 42 is transferred to the process chamber SP1 (in FIG. 4) by using the robot 62a (in FIG. 4) to form a ruthenium seeding layer 43 on the insulating layer 42 and in the opening region 46. The process chamber SP1 is controlled at a pressure of about 0.5 mTorr to about 5 mTorr. And the surface of the wafer is controlled at a temperature of about 100° C. to about 500° C.

According to an embodiment of the present invention, the ruthenium seeding layer 43 is formed by sputtering. A thickness of the ruthenium seeding layer 43 is formed of about 5 Å to about 100 Å by sputtering. Preferably, the thickness of the ruthenium seeding layer 43 is formed of about 30 Å to about 70 Å.

After forming the ruthenium seeding layer 43, the wafer having the ruthenium seeding layer 43 is transferred to the process chamber C1 (in FIG. 4) by using robots 62a and 62b (in FIG. 4) to form a ruthenium seeding buffer layer 44 by CVD. As the internal pressure of the second transfer chamber 64 (in FIG. 4) maintains close to a given target pressure for forming the ruthenium seeding buffer layer 44, the process chamber C1 maintains at a target pressure of about 0.5 Torr to about 40 Torr. However, if the CVD for forming the ruthenium seeding layer is performed in the apparatus in FIG. 5, the processing chamber C3 (in FIG. 5) is controlled to maintain a pressure of about 0.5 Torr to about 40 Torr by regulating the pressure control unit 72 (in FIG. 5).

For the CVD, a ruthenium containing organometallic compound flows into the process chamber C1 (in FIG. 4). The ruthenium containing organometallic compound includes Ru(EtCp)$_2$, wherein EtCp denotes ethyl cyclopentadienyl ligand.

During forming the ruthenium seeding buffer layer 44, an oxygen gas flows to the process chamber C1 (in FIG. 4) at a rate of about 10 sccm (standard cm$^3$/min) to 3,000 sccm to decompose the ruthenium containing organometallic compound. The thickness of the ruthenium seeding buffer layer 44 is formed as thin as possible. Preferably, it is sufficient to cover the ruthenium seeding layer 43, especially, to cover the vertical wall of the ruthenium seeding layer 43. If the pressure of the process chamber C1 (in FIG. 4) maintains in the range from about 10 Torr to about 40 Torr, the flow rate of the oxygen gas is in the range from about 10 sccm to about 3,000 sccm. According to an embodiment of the present invention, as increasing the flow rate of the oxygen gas, morphology of the ruthenium seeding layer 43 can be improved.

An inert gas such as a nitrogen gas can flows into the process chamber C1. The flow rate of the inert gas is determined according to the flow rate of the oxygen gas.

According to an embodiment of the present invention, the sum of the flow rate of the oxygen gas and the inert gas is over about 1,000 sccm. Preferably, the flow rate of the inert gas is in the range from about 10 sccm to about 2,000 sccm. If the flow rate of the oxygen gas is high, for example, about 1,000 sccm to about 3,000 sccm, the pressure of the process chamber C1 (in FIG. 4) maintains in the range from about 0.5 Torr to about 10 Torr.

After forming the ruthenium seeding buffer layer 44, a ruthenium main layer 45 is formed. The wafer having the ruthenium seeding buffer layer 44 is transferred to another process chamber C2 (in FIG. 4) by way of the second transfer chamber 64. The pressure of the process chamber C2 (in FIG. 4) maintains lower than the pressure of the process chamber C1 (in FIG. 4) and higher than the pressure of the sputtering process chamber SP1 (in FIG. 4) by regulating the pressure control unit 67 (in FIG. 4). According to the preferred embodiment of the present invention, the pressure of the process chamber C2 is in the range from about 0.1 Torr to about 10 Torr, preferably from about 0.5 Torr to about 5 Torr.

During forming the ruthenium main layer 45, an oxygen gas is flowed to the process chamber C2 (in FIG. 4) at a rate of about 10 sccm to 300 sccm to decompose the ruthenium containing organometallic compound. According to a preferred embodiment of the present invention, the flow rate of the oxygen gas for forming the ruthenium main layer 45 is lower than the flow rate of the oxygen gas for forming the ruthenium seeding buffer layer 44.

The temperature of the wafer in the process chamber C1 and C2 (in FIG. 4) is about 250° C. to about 450° C. when the ruthenium seeding buffer layer 44 and the ruthenium main layer 45 are formed. If the temperature of the wafer is under about 250° C., the rate of forming the ruthenium layer including the ruthenium seeding buffer layer 44 and the ruthenium main layer 45 is so slow. If the temperature of the wafer is over about 450° C., characteristics such as step coverage of the ruthenium layer is poor.

According to an embodiment of the present invention, if the ruthenium containing organometallic compound is Ru(EtCp)$_2$, the wafer for forming the ruthenium layer maintains at a temperature in a range from about 250° C. to about 350° C. And if the temperature of the wafer is low, the ruthenium seeding buffer layer 44 can be densely formed, so that the process chamber C1 (in FIG. 4) for forming the ruthenium seeding buffer layer 44 is controlled lower temperature of about 10° C. to about 30° C. than the process chamber C2 (in FIG. 4) for forming the ruthenium main layer 45.

Figure 1:
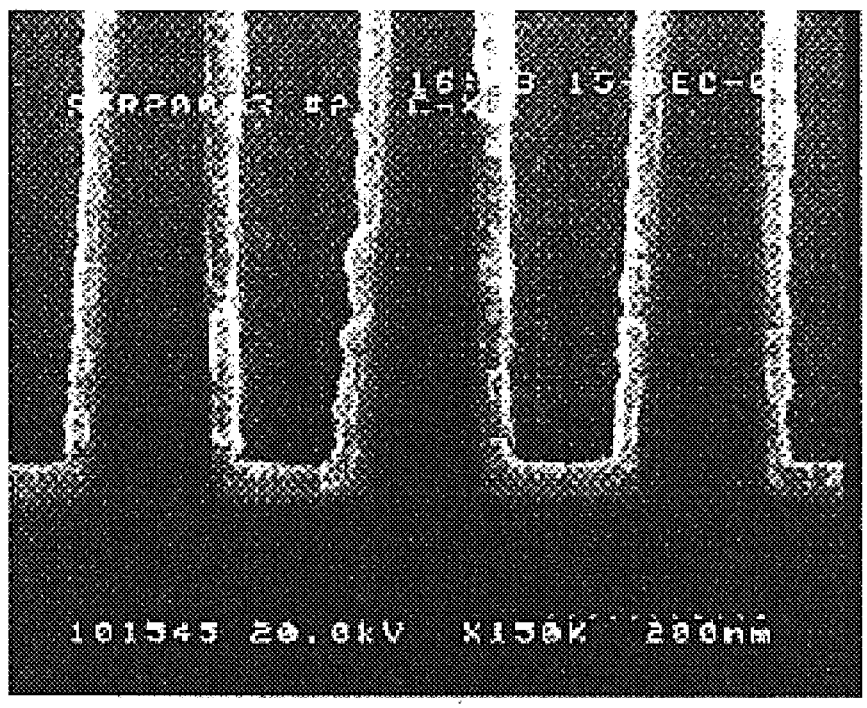
FIG. 1 is a scanning electron microphotograph (SEM) showing a cross-sectional view of a conventional semiconductor device having a ruthenium layer.
Figure 2A:
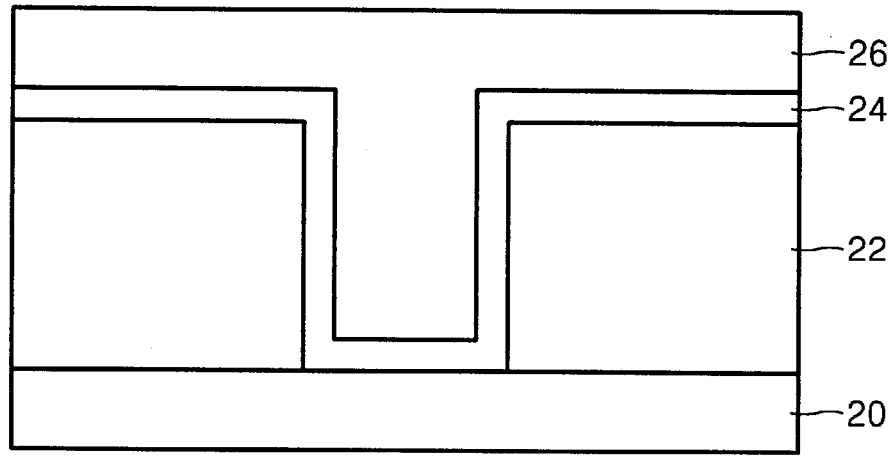
FIGS. 2A and 2B are cross-sectional views of a conventional semiconductor device having a ruthenium layer.
Figure 2B:
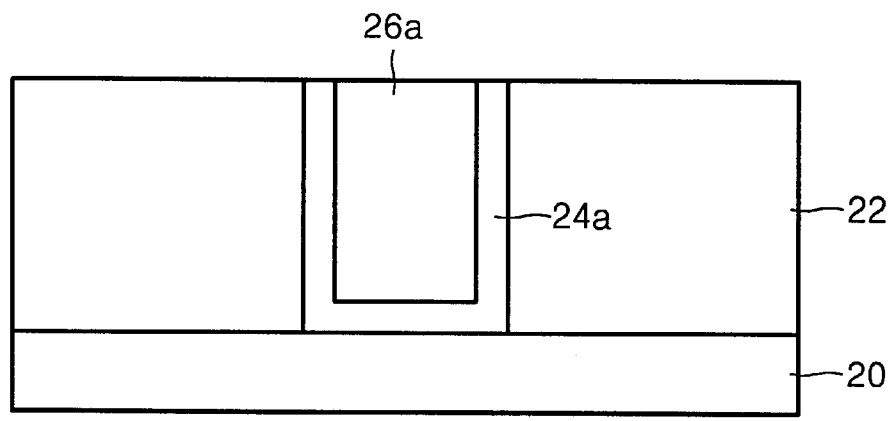
Figure 3:
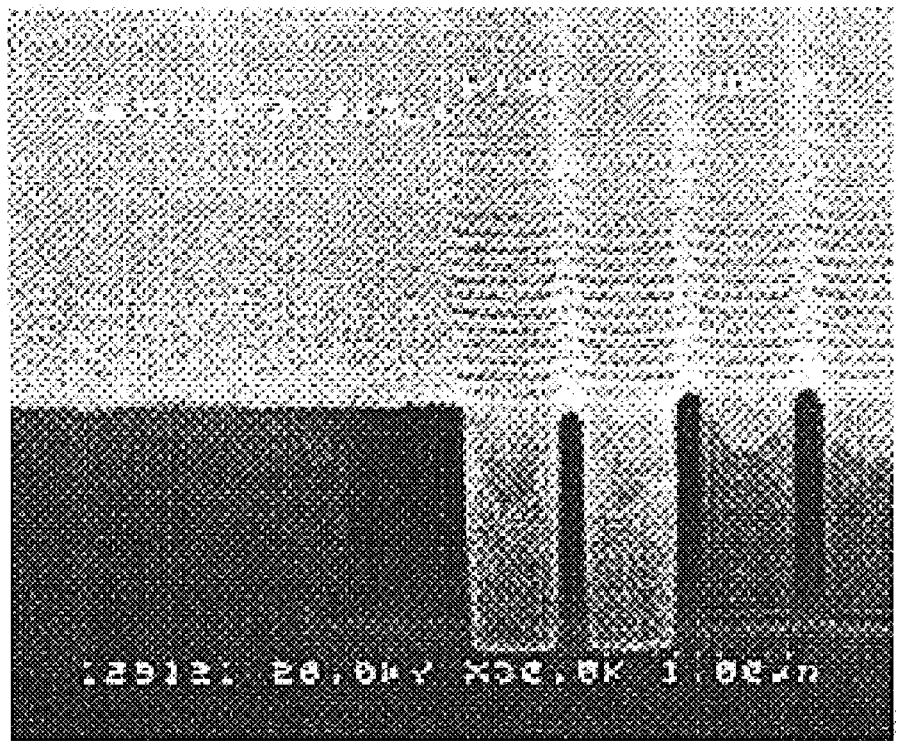
FIG. 3 is a SEM showing a cross-sectional view of a conventional semiconductor device having a ruthenium layer and a ruthenium supporting layer.
Figure 7:
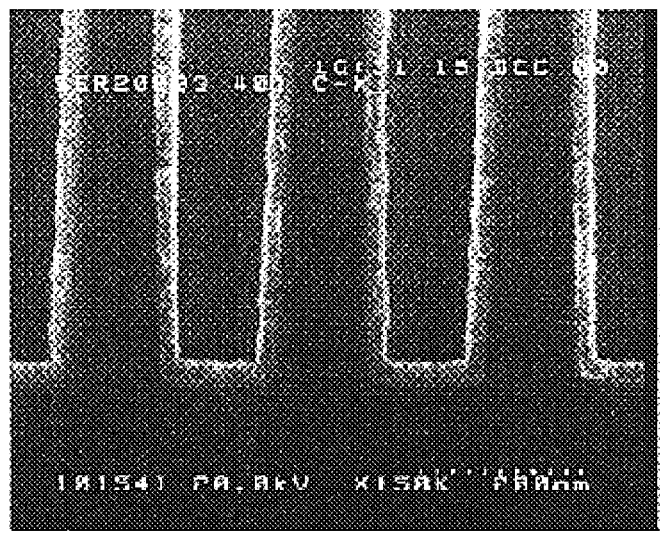
FIG. 7 is a SEM showing a cross-sectional view of a semiconductor having a ruthenium layer according to the present invention.

FIG. 7 is a SEM showing a cross-sectional view of structure having a ruthenium layer according to an embodiment of the present invention. For taking the SEM, a ruthenium seeding layer is formed by sputtering at a temperature of about 200° C. for about 5 minutes. A ruthenium seeding buffer layer is formed by CVD on the ruthenium seeding layer at a temperature of about 320° C. for about 30 seconds. A ruthenium main layer is formed by CVD on the ruthenium seeding buffer layer at a temperature of about 320° C. for about 30 seconds. Comparing to the conventional morphology of FIG. 1, morphology of the ruthenium layer of the present invention, especially vertical profile, is considerably improved.

Figure 8:
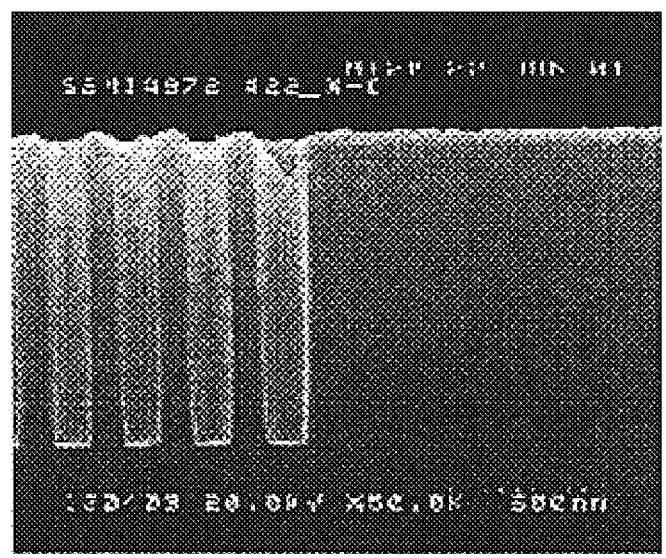
FIG. 8 is a SEM showing a cross-sectional view of structure between a ruthenium layer and a ruthenium supporting layer according to the present invention.

FIG. 8 is a SEM showing a cross-sectional view of structure between a ruthenium layer and a ruthenium supporting layer according to the present invention. According to an embodiment of the present invention, during forming a semiconductor device having a ruthenium layer, an etchant such as BOE (buffered oxide etchant) do not permeate between a ruthenium layer and a ruthenium supporting layer which is disposed under the ruthenium layer as shown in FIG. 8, thereby preventing the semiconductor device from deteriorating. And during heat treatment after forming the ruthenium layer, as the ruthenium supporting layer under the ruthenium layer is not exposed, reliability of the semiconductor device is improved.

Although the present invention has been described herein with reference to the accompanying drawings, it is to be understood that the present invention is not limited to those precise embodiments, and various other changes and modifications may be affected therein by one skilled in the art without departing from the scope or spirit. It will be apparent to one of ordinary skill in the art that modifications of the described embodiment may be made without departing from the spirit and scope of the invention. All such changes and modifications are intended to be included within the scope of the invention as defined by the appended claims.

What is claimed is:

1. A method for fabricating a semiconductor device, the method comprising the steps of:
   forming an insulating layer having an opening region on a semiconductor substrate;
   forming a first ruthenium layer on the insulating layer and he opening region by sputtering at a first pressure;
   forming a second ruthenium layer on the first ruthenium layer by first chemical vapor deposition (CVD) at a first flow rate of oxygen gas and at a second pressure, wherein the second pressure is greater than the first pressure; and
   forming a third ruthenium layer on the second ruthenium layer by second CVD at a second flow rate of oxygen gas and at a third pressure, wherein the third pressure is greater than the first pressure.

2. The method of claim 1, wherein the first flow rate of oxygen gas is higher than the second flow rate of oxygen gas.

3. The method of claim 1, wherein the second pressure is greater than the third pressure.

4. The method of claim 1, wherein the first pressure is in the range from about 0.5 mTorr to about 5 mTorr.

5. The method of claim 1, wherein the second pressure is in the range from about 10 Torr to about 40 Torr.

6. The method of claim 1, wherein the first flow rate of oxygen gas is in the range from about 10 sccm to about 3,000 sccm.

7. The method of claim 6, further including an inert gas flowing with the oxygen gas.

8. The method of claim 7, wherein the flow rate of the inert gas is in the range from about 10 sccm to about 2,000 sccm.

9. The method of claim 1, wherein the second pressure is in the range from about 0.5 Torr to about 10 Torr.

10. The method of claim 9, wherein the first flow rate of oxygen gas is in the range from about 1,000 sccm to about 3,000 sccm.

11. The method of claim 1, wherein the third pressure is in the range from about 0.1 Torr to about 10 Torr, and the second flow rate of oxygen gas is in the range from about 10 sccm to about 300 sccm.

12. The method of claim 1, wherein the step of forming the first ruthenium layer is performed at a semiconductor substrate temperature of about 100° C. to about 500° C.

13. The method of claim 1, wherein the step of forming the second ruthenium layer and the step of forming the third ruthenium layer are performed at a semiconductor substrate temperature of about 250° C. to about 450° C.

14. The method of claim 13, wherein the step of forming the second ruthenium layer is performed at semiconductor substrate temperature lowered by about 10° C. to about 30° C. than the step of forming the third ruthenium layer.

15. The method of claim 1, wherein the step of forming the first ruthenium layer, the step of forming the second ruthenium layer, an the step of forming the third ruthenium layer are performed in-situ.

16. The method of claim 1, wherein the step of forming the second ruthenium layer and the step of forming the third ruthenium layer are performed in a same chamber.

17. The method of claim 1, wherein the step of forming the second ruthenium layer and the step of the forming the third ruthenium layer use a ruthenium containing organometallic compound.

18. The method of claim 17, wherein the ruthenium containing organometallic compound includes $Ru(EtCp)_2$, wherein EtCp denotes ethyl cyclopentadienyl ligand.

19. The method of claim 18, wherein the step of forming the second ruthenium layer and the step of forming the third ruthenium layer are performed at a semiconductor substrate temperature of about 250° C. to about 350° C.

* * * * *